United States Patent [19]
Poenisch et al.

[11] Patent Number: 5,985,692
[45] Date of Patent: Nov. 16, 1999

[54] PROCESS FOR FLIP-CHIP BONDING A SEMICONDUCTOR DIE HAVING GOLD BUMP ELECTRODES

[75] Inventors: Paul Poenisch, Santa Clara; James A. Matthews, Milpitas; Trancy Tsao, Saratoga, all of Calif.

[73] Assignee: MicroUnit Systems Engineering, Inc., Sunnyvale, Calif.

[21] Appl. No.: 08/478,114

[22] Filed: Jun. 7, 1995

[51] Int. Cl.[6] .................. H01L 21/283; H01L 21/603
[52] U.S. Cl. .................. 438/106; 438/115; 438/614; 438/615; 438/653; 438/654; 438/661; 438/677; 438/686; 438/760; 438/763; 228/180.22
[58] Field of Search ................ 437/183; 228/180.22; 257/737, 738; 438/614, 615, 653, 654, 106, 115, 661, 677, 686, 760, 763

[56] References Cited

U.S. PATENT DOCUMENTS

| | | | |
|---|---|---|---|
| 4,875,617 | 10/1989 | Citowsky | 228/123 |
| 4,921,157 | 5/1990 | Dishon et al. | 228/124 |
| 5,075,965 | 12/1991 | Carey et al. | 29/840 |
| 5,108,027 | 4/1992 | Warner et al. | 228/254 |
| 5,147,822 | 9/1992 | Yamazaki et al. | 437/215 |
| 5,149,671 | 9/1992 | Koh et al. | 437/183 |
| 5,168,346 | 12/1992 | Pasch et al. | 257/738 |
| 5,183,972 | 2/1993 | Duane et al. | 174/251 |
| 5,237,130 | 8/1993 | Kulesza et al. | 174/260 |
| 5,249,733 | 10/1993 | Brady et al. | 228/180.22 |
| 5,299,730 | 4/1994 | Pasch et al. | 228/180.22 |
| 5,344,607 | 9/1994 | Gonya et al. | 420/562 |
| 5,346,857 | 9/1994 | Scharr et al. | 437/183 |
| 5,359,768 | 11/1994 | Haley | 29/840 |
| 5,366,692 | 11/1994 | Ogashiwa | 420/565 |
| 5,368,217 | 11/1994 | Simmons et al. | 228/6.2 |
| 5,368,814 | 11/1994 | Gonya et al. | 420/587 |
| 5,377,902 | 1/1995 | Hayes | 228/254 |
| 5,381,039 | 1/1995 | Morrison | 257/701 |
| 5,385,869 | 1/1995 | Liu et al. | 437/209 |
| 5,391,514 | 2/1995 | Gall et al. | 437/183 |
| 5,393,489 | 2/1995 | Gonya et al. | 420/561 |
| 5,393,696 | 2/1995 | Koh et al. | 437/183 |
| 5,404,045 | 4/1995 | Mizushima | 257/698 |
| 5,404,265 | 4/1995 | Moresco et al. | 361/306.1 |
| 5,406,701 | 4/1995 | Pepe et al. | 29/840 |
| 5,407,121 | 4/1995 | Koopman et al. | 228/206 |
| 5,410,805 | 5/1995 | Pasch et al. | 29/830 |
| 5,411,703 | 5/1995 | Gonya et al. | 420/561 |
| 5,609,290 | 3/1997 | Bobbio et al. | 228/206 |

OTHER PUBLICATIONS

Caillat et al., "Fluxless Flip–Chip Technology", 1994 ITAR & Flip Chip Proceedings, pp. 32–36.

Clementi et al., "Flip–Chip Assembly on CQFP Using No–Clean Processing", '95 Flip Chip, BGA, TAB & AP Symposium, pp. 1–6.

Kallmayer et al., "Experimental Results on the Self–Alignment Process Using Au/Sn Metallurgy and on the Growth of the ζ–Phase During the Reflow", '95 Flip Chip, BGA, TAB & AP Symposium, pp. 225–236.

Gupta, Application of Thermal and Kinetic Modeling to the Reflow and Flip Chip Bonding of Bumps using the Au—Sn—Au, '95 Flip Chip, BGA, TAB & AP Symposium, pp. 164–172.

*Primary Examiner*—David Graybill
*Attorney, Agent, or Firm*—McDermott Will & Emery

[57] ABSTRACT

A method for flip-chip bonding an integrated circuit die to a substrate. The method includes the steps of providing the integrated circuit die with at least one gold bump, forming a barrier layer on the gold bump, forming a bronzing agent on the barrier layer, and providing the substrate with at least one conductive bonding area, which is also covered with gold. The bronzing agent on the integrated circuit die is then aligned on the conductive bonding area, and a compression force is applied to the die and substrate so as to establish contact between the bronzing agent and the conductive bonding area. While maintaining position between the gold bump and conductive bonding area, the structure is alloyed such that the bronzing agent and the gold on the conductive bonding area form an intermetallic compound, thereby forming a bond between the die and the substrate. The barrier layer functions to prevent the bronzing agent from diffusing with the gold bump.

31 Claims, 5 Drawing Sheets

PROCESS FOR FLIP-CHIP BONDING A SEMICONDUCTOR DIE HAVING GOLD BUMP ELECTRODES

BACKGROUND OF THE INVENTION

The present invention relates, in general, to a method and structure for bonding integrated circuit chips and, more particularly, to fluxless flip-chip bonding processes.

An increasingly important aspect of manufacturing an integrated circuit chip, also referred to as an integrated circuit die, is mounting the integrated circuit chip to a substrate. Often times, the goal of this task is to provide the chip with as many input/output ("I/O") terminals as possible. Flip-chip bonding is one of various surface mounting techniques which have been developed in an effort to provide high density area interconnections between the chip and the substrate.

In the flip-chip bonding process, the die is mounted directly to the substrate. Generally, the flip-chip process entails disposing a plurality of solder bumps on the uppersurface of the die, flipping the die and mating these solder bumps with corresponding bonding pads located on the substrate, and then heating the die and the substrate so as to reflow the solder bumps. Once reflowed each bump forms a bond between the die and the substrate, which functions as both an electrical and physical contact.

However, previously known flip-chip bonding processes suffer from various drawbacks. For example, the controlled collapse chip connection ("C4") flip-chip bonding process utilizes solder bumps comprising a lead-tin alloy, which require an activating agent, such as flux, to reduce the oxides which form on the surface of the bump. The oxides must be removed if an adequate bond between the die and the substrate is to be obtained. However, the use of flux leaves a residue, which must be removed in order to prevent corrosion problems. Such cleaning is a difficult process to accomplish, and adds both time and cost to the manufacturing process. Furthermore, the use of the lead-tin alloy is often unsatisfactory because of its tendency to fracture due to thermal stress. The C4 flip-chip bonding process also exhibits surface tension between the solder bump and the bonding pad, which disadvantageously functions to limit the minimum allowable pitch (i.e., distance between solder bumps).

Another drawback associated with the C4 process is that for proper operation the minimum allowable size of the solder bumps range from 3–5 mils. Notwithstanding the fact that the size of the solder bumps cannot be further reduced (a further reduction would allow more bumps per area), since the entire solder bump becomes liquid during the bonding process, the substantial size of the bump increases the probability of a bump forming a short circuit with one or more adjacent bumps during the bonding process.

Another known flip-chip bonding process can be referred to as the indium-bump process. In this process, the solder bump comprising indium formed on the die is brought into contact with the bonding pad on the substrate, and then heated so as to cause the solder bump to reflow and form a solder column. While, this process does not rely on surface tension to assist in the alignment process, the materials utilized for the solder bumps still require the use of flux to remove the oxides prior to the reflow process. As such, the indium-bump process suffers from the same drawbacks as set forth above. In addition, as indium melts at 120 C, once the reflow process is completed, further high temperature operations are prohibited. Furthermore, the indium column which bonds the die to the substrate is a relatively low strength structure. As such, the bond is susceptible to fractures resulting from forces applied during subsequent processing techniques and/or during normal operating conditions.

Another known flip-chip process is gold thermal compression bonding. According to this process, a gold bump formed on the die is brought into contact with a gold bonding pad disposed on the substrate. The gold bump and the gold bonding pad are then joined by heating the structure while simultaneously pressing the bump and pad together. However, when attempting to bond a die having on the order of 1000 solder bumps, this technique is inadequate due to the fact that machines capable of exerting the necessary compression force are commercially unavailable.

Another disadvantage with this process is that large deformations of the bump are required to generate an acceptable bond. Typically, the force applied must be sufficient to deform approximately 30% of the bump. Application of such force can result in undesirable piezoelectric effects when applied to a substrate already containing circuit elements, as well as result in short circuits with adjacent bumps.

It has also been known to use gold bumps having either a layer of tin, or possibly indium, disposed thereon in the flip-chip bonding process. Specifically, a gold bump comprising tin disposed on the die is brought into contact with a gold bonding pad disposed on the substrate. The structure is then subjected to a reflow process such that the tin and the gold form an intermetallic compound which functions as a bond between the die and the substrate. However, disadvantageously, this technique requires the use of a flux, and therefore suffers from the associated problems. In addition, the use of tin results in an unreliable contact, as tin forms open circuits over time.

In addition to the aforementioned problems, except for the C4 process, none of the foregoing flip-chip bonding processes allow for the formation of a hermetic seal surrounding the integrated circuit die simultaneously with the bonding of the die to the substrate. This results from the need to remove the flux from the bonds formed during the flip-chip bonding process. However, while the C4 process allows the generation of a hermetic seal, the seal formed is too large, typically on the order of 250 microns.

Accordingly, there is a need for a flip-chip bonding process for bonding a die having bumps (i.e., I/O ports) ranging in number from 1 to over 1000 that is inexpensive, that does not require the use of a flux, that does not require excessive compression forces, that minimizes reliability problems, such as those associated with the use of tin, and that allows for the formation of a hermetic seal which surrounds each individual integrated circuit die.

SUMMARY OF THE INVENTION

The present invention provides a method and structure for implementing the flip-chip bonding process which satisfies the aforementioned needs. Specifically, the invention provides a method and structure for performing flip-chip bonding that does not require the use of flux or excessive compression forces and which exhibits improved reliability performance. The present invention also provides a method and structure for forming a hermetic seal surrounding the integrated circuit die simultaneously with the bonding of the integrated circuit die to the substrate.

Accordingly, the present invention relates to a method for flip-chip bonding an integrated circuit die to a substrate. The method comprises the steps of providing the integrated circuit die with at least one gold bump, forming a barrier layer on the gold bump, forming a bronzing agent on the barrier layer, and providing the substrate with at least one conductive bonding area, which is also covered with gold. The bronzing agent on the integrated circuit die is then aligned on the conductive bonding area, and a compression force is applied to the die and substrate so as to establish contact between the bronzing agent and the conductive bonding area. While maintaining position between the gold bump and conductive bonding area, the structure is alloyed such that the bronzing agent and the gold on the conductive bonding area form an intermetallic compound, thereby forming a bond between the die and the substrate. The barrier layer functions to prevent the bronzing agent from diffusing with the gold bump disposed on the integrated circuit die.

The present invention also relates to a method for forming a hermetic seal between an integrated circuit die and a substrate. The method comprises the steps of providing the integrated circuit die with a first continuous gold band, forming a barrier layer on the gold band, forming a bronzing agent on the barrier layer, providing the substrate with a second continuous gold band which is substantially the mirror image of the first gold band, aligning the bronzing agent on the second gold band, providing a compression force so as to establish contact between the bronzing agent and the second gold band, and alloying the structure such that the bronzing agent and the second gold band form a hermetic seal between the integrated circuit die and the substrate.

As described in detail below, the flip-bonding method of the present invention provides important advantages. Most importantly, the novel flip-chip bonding method provides a bonding process that does not require the use of flux or excessive compression forces and which exhibits improved reliability performance. In addition, the method and structure of the present invention provides for the hermetic sealing of the die simultaneously with the bonding of the die to the substrate.

The invention itself, together with further objects and attendant advantages, will best be understood by reference to the following detailed description, taken in conjunction with the accompanying drawings.

DETAILED DESCRIPTION OF THE DRAWINGS

Figure 1:
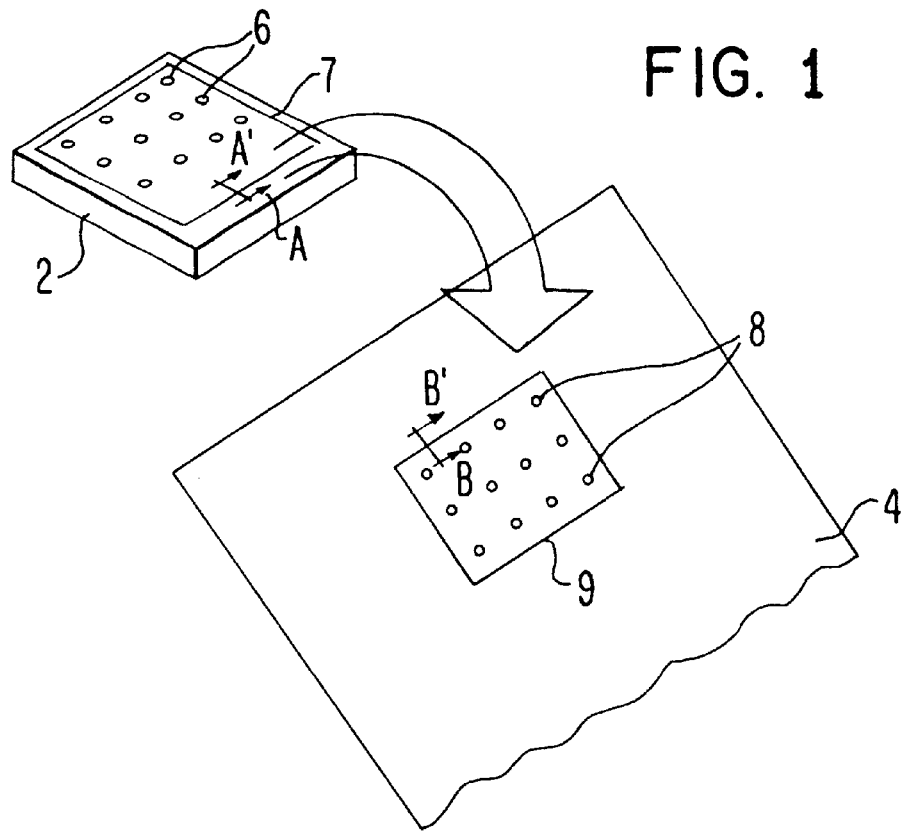
FIG. 1 is a representation of the general arrangement of the integrated circuit die and the substrate in the flip-chip bonding process.

Referring to FIG. 1, an integrated circuit die 2 and a substrate component 4 comprise a plurality of bumps 6 and bonding pads 8, respectively. The bumps 6 are present at the input/output ports (i.e., both signal and power) of the integrated circuit die 2. Each bump 6 has a corresponding bonding pad 8 disposed on the substrate 4 such that when the die 2 is mounted to the substrate 4, the bumps 6 and the bonding pads 8 align with one another.

Figure 2:
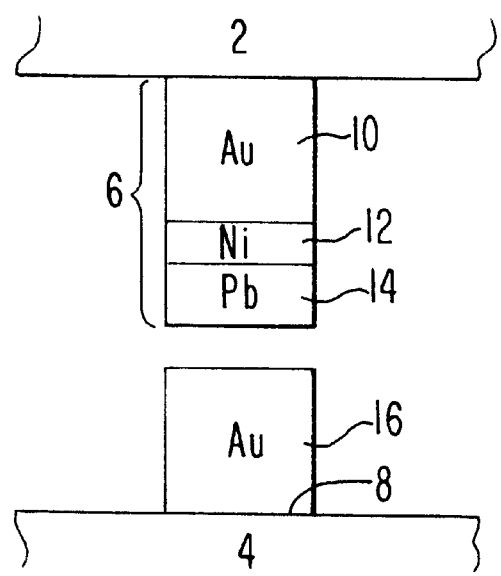
FIG. 2 is a substantially enlarged side view of the integrated circuit die and the substrate prepared in accordance with a first embodiment of the present invention, prior to the alloying process.

An enlarged side view of the bumps 6 and the bonding pads 8 prepared in accordance with the first embodiment of the present invention, prior to the alloying process, is set forth in FIG. 2. As shown, the bump 6 formed on the die 2 comprises a gold bump 10, a barrier layer 12 and a bronzing agent 14. The bonding pad 8 disposed on the substrate 4 comprises a gold bump 16.

According to the present invention, the gold bump 10, comprising at least about 90 weight % Au, is deposited on the die 2 by means including electroplating or evaporative lift-off, so as to form a cube-like structure having minimum dimensions of approximately 20 h×25 l×25 w microns. The barrier layer 12 is then deposited on top of the gold bump 10, and the bronzing agent 14 is deposited on top of the barrier layer 12. The barrier layer 12 and the bronzing agent 14 may be disposed by means including electro or electroless plating or evaporative lift-off.

In the preferred embodiment, the barrier layer 12 comprises at least about 90% nickel and has a thickness ranging from approximately 1000 to 3000 angstroms, and the bronzing agent 14 comprises about 100% lead and has a thickness ranging from approximately 4–5 microns. As a result, bump 6 exhibits a cube-like structure having minimum dimensions of approximately 25 h×25 l×25 w microns. A bronzing agent comprising substantially 100% lead is preferred because of its superior electroplating properties. However, a bronzing agent comprising a lead-indium alloy or substantially pure indium can also be utilized. The gold bump 16 of the bonding pad 8, which is formed in the same manner as the gold bump 10 on the die 2, also forms a cube-like structure having minimum dimensions of approximately 25 h ×25 l×25 w microns. Of course, the formation of larger bumps is also possible.

The minimum thickness of the barrier layer 12 is governed by the requirement that the barrier be sufficient to prevent diffusion between the gold bump 10 and the bronzing agent 14 during the alloying process. Other materials are also suitable for use in the barrier layer 12, for example, chromium and tungsten.

Turning to the bronzing agent 14, in addition to the function of forming a bond with the gold bump 16, the bronzing agent 14 also functions to compensate for variations in the height of the gold bumps 10,16. During the alloying process the bronzing agent 14 will deform so as to compensate for differences in height of the gold bumps 10,16. As such, the minimum thickness of the bronzing agent 14 must be greater than the maximum expected height variation of the gold bumps. For example, assuming variations in bump height range in the order of 2–3 microns, a bronzing agent layer 14 having a minimum thickness of approximately 4 microns would be acceptable. The maximum thickness of the bronzing agent 14 is governed by the requirement that once deformed the bronzing agent 14 cannot be allowed to contact an adjacent bump or the deformed bronzing agent associated with an adjacent bump.

In accordance with the present invention, the bronzing agent 14 is selected so as to have a lower yield point than the gold utilized for the gold bumps 10,16 in the die 2 and the substrate 4 (i.e., under an applied force, the bronzing agent 14 will deform prior to deformation of the gold). As a result, when a compression force is applied, the bronzing agent 14 will compensate for variations in the height of the gold bumps 10,16. For example, the bronzing agents 14 corresponding to gold bumps 6 that exceed a predefined height will be deformed during application of the compression force such that the overall height of each bump 6 and the corresponding bump 16 is substantially the same.

Next, the alloying process of the present invention is described with reference to FIGS. 2 and 3. First, as shown in FIG. 2, the integrated circuit die 2 is positioned relative to the substrate 4 such that the bump 6 of the die 2 is aligned with the gold bump 16 disposed on the substrate 4. Thus, the bronzing agent 14 faces the gold bump 16 on the substrate 4.

Figure 3:
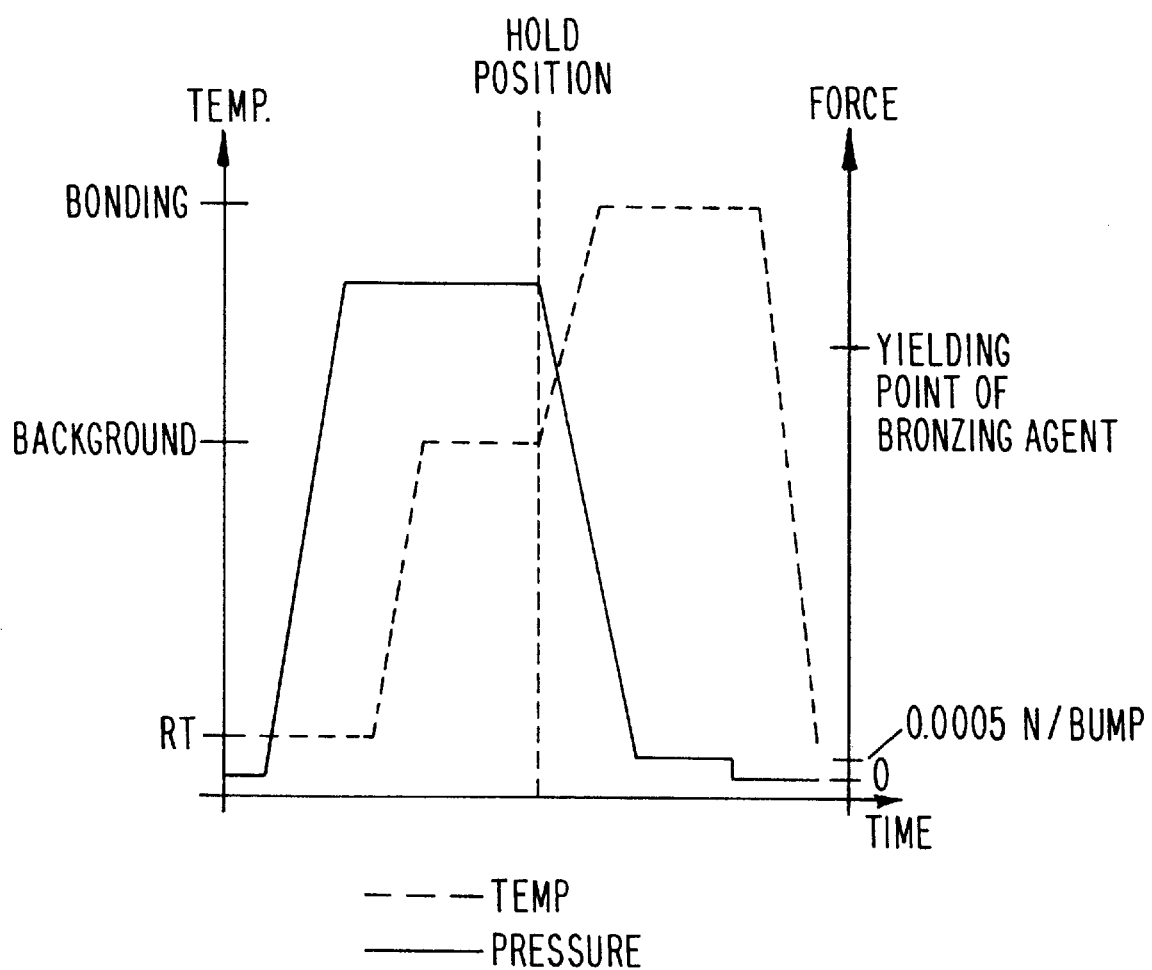
FIG. 3 illustrates the alloying process of the present invention.

Next, referring to FIG. 3, which illustrates the various temperatures and forces applied to the structure during the alloying process, while at room temperature ("RT") a compression force is applied to the structure so as to establish contact between the bronzing agent 14 of bump 6 and the gold bump 16 of the bonding pad 8. The compression force ranges from approximately 0.03 to 0.20 N/bump. The compression force must be sufficient to cause the bronzing agent 14 to yield, but be below the yielding point of the gold bumps 10,16. When using a bronzing agent 14 comprising 100% lead, a compression force of approximately 0.1 N/bump is appropriate.

Once the compression force is raised above the yield point of the bronzing agent 14, the temperature is then raised from room temperature to the background temperature. The background temperature must be high enough to allow the bronzing agent 14 to yield, but below the eutectic temperature of the bronzing agent/gold composition. For example, if the bronzing agent 14 is lead, a background temperature ranging from 190–210 C is appropriate. The temperature is held at the background temperature for a duration sufficient for the bronzing agent 14 to yield. Once the yielding of the bronzing agent 14 is complete, the distance between the integrated circuit die 2 and the substrate 4 must be maintained during the subsequent bonding process. This is necessary to ensure that the bumps 6,16 are not pushed together, thereby displacing all liquid, which is formed during the bonding process, from between the bumps. Liquid must be maintained between the bumps 6,16 during the bonding process to form the hermetic seal.

Once the bronzing agent 14 has been deformed so as to compensate for the variations in bump height, the temperature is raised to the bonding temperature, which must exceed the eutectic of the bronzing agent/gold compound. For example, if the bronzing agent 14 is lead, a bonding temperature exceeding approximately 255 C is preferred, because as stated below, it is desirable to form the intermetallic compound AuPb2.

During the bonding process (i.e., period of alloying cycle at the bonding temperature), which is sufficient to allow the structure to equibrilate, the barrier layer 12 functions to prevent the gold bump 10 formed on the die 2 from diffusing into the bronzing agent 14. As such, the gold bump 16 on the bonding pad 8 diffuses with the bronzing agent 14, thereby forming one or more intermetallic compounds 13. The intermetallic compound 13 functions as bond between the die 2 and the substrate 4.

In the present embodiment, the bronzing agent 14 and the gold bump 16 form a gold-lead intermetallic compound. More specifically, referring to the gold-lead phase diagram set forth in FIG. 7, in the preferred embodiment the bonding temperature during is such that the intermetallic compound AuPb2 is formed.

Importantly, the alloying process of the present invention can be carried out without the use of flux. This is accomplished by the use of a plasma gas, such as CF4, which is applied to the bronzing agent 14 prior to the alloying process. The plasma gas functions to eliminate the oxides formed on the bronzing agent 14, thereby allowing for proper wetting of the bronzing agent during the alloying process.

Alternatively, a thin layer of platinum or gold (not shown in FIG. 2) can be deposited on the bronzing agent 14. The thin layer of either platinum or gold functions to prevent oxidation of the bronzing agent 14 prior to the alloying process. However, during the alloying process, the thin layer of either gold or platinum dissolves into the bronzing agent 14, and as a result, the bronzing agent 14 can properly wet, and thereby form an adequate bond between the die 2 and the substrate 4. With regard to the thickness range of such gold or platinum layers, the lower limit is governed by the requirement that the layer act as a barrier to oxygen, while the upper limit is governed by the requirement that the layer be insufficient to consume the bronzing agent 14 during the alloying process. Approximate ranges for such gold and platinum layers are 200–500 angstroms and 100–200 angstroms, respectively.

Figure 4:
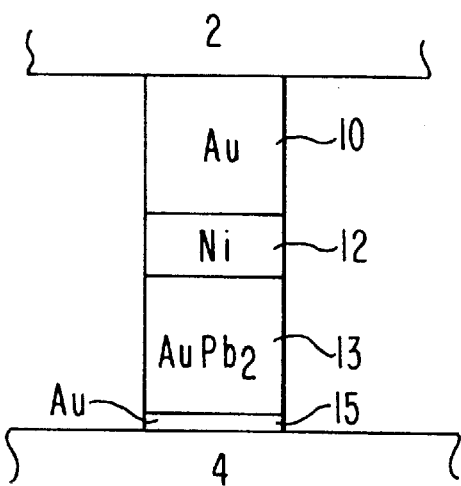
FIG. 4 illustrates a substantially enlarged side view of a flip-chip bond in accordance with the first embodiment of the present invention.

FIG. 4 illustrates a substantially enlarged view of a flip-chip bond in accordance with the first embodiment of the present invention. As shown in FIG. 4, after the alloying process the bronzing agent 14 is diffused with the gold bump 16 on the substrate 4 to form an intermetallic compound 13. In addition, unreacted gold 15 remains on the substrate 4. As stated above, in the preferred embodiment, the gold-lead intermetallic compound AuPb2 is formed.

Figure 5:
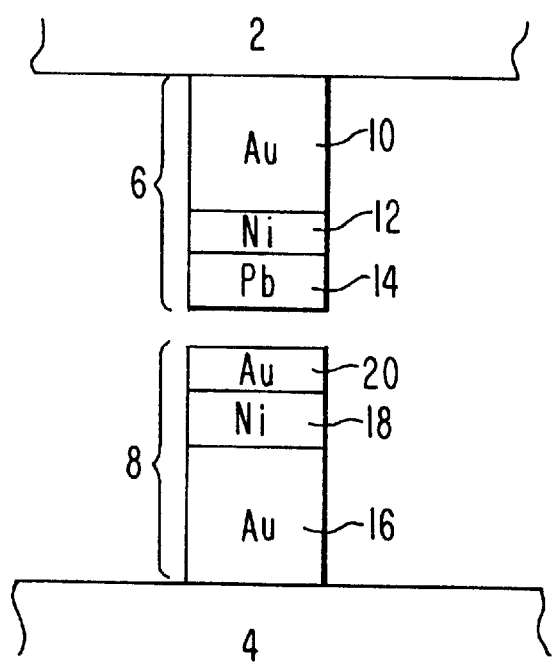
FIG. 5 is a substantially enlarged side view of the integrated circuit die and the substrate prepared in accordance with a second embodiment of the present invention, prior to the alloying process.

FIG. 5 illustrates a second embodiment of the present invention. As shown in FIG. 5, in the second embodiment, an additional barrier layer 18 is disposed on top of the gold bump 16 formed on the bond pad 8. Similar to the barrier layer 12 formed in bump 6 in the first embodiment, the barrier layer 18 comprises at least about 90% nickel and has a thickness sufficient to prevent diffusion between the gold bump 16 and the bronzing agent 14. Furthermore, an additional gold layer 20 is formed on top of the barrier layer 18. In the second embodiment, this gold layer 20 comprises the same material as the gold bumps 10 and 16, and has a approximate height ranging from about 2000 to about 10000 angstroms. In all other aspects, the first and second embodiments are the same.

The second barrier layer 18 functions to prevent the gold bump 16 disposed on the bonding pad 8 from diffusing with the bronzing agent 14 during the alloying process. As a result, during the alloying process, the bronzing agent 14 can only diffuse with the gold layer 20.

Figure 7:
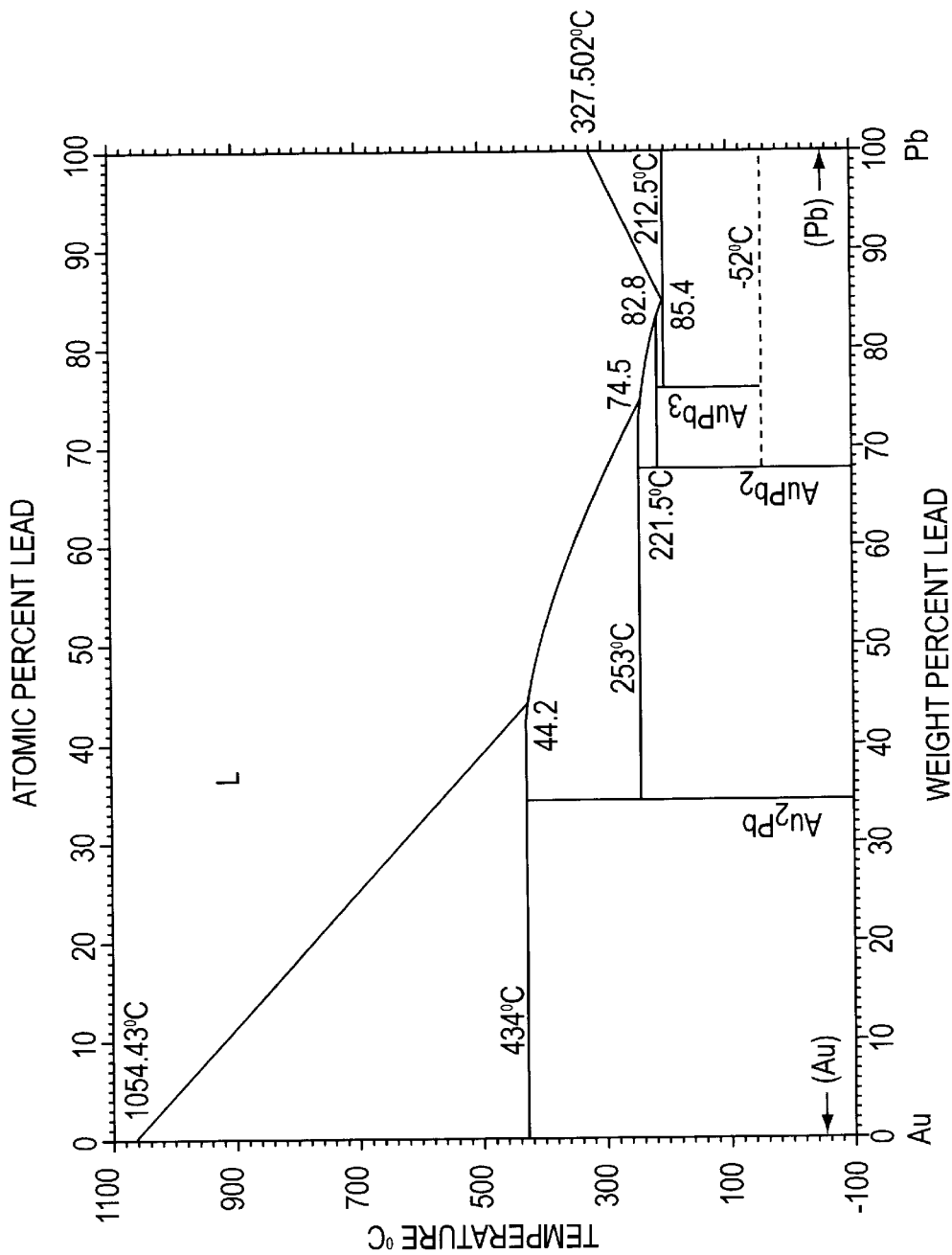
FIG. 7 illustrates the gold-lead phase diagram.

The benefits resulting from the inclusion of the second barrier layer 18 are explained with reference to FIG. 7. As shown in the lead-gold phase diagram, as the amount of gold in a lead-gold compound increases, the melting point of the lead-gold intermetallic compound increases rapidly. Accordingly, to ensure that sufficient lead-gold intermetallic compound enters a liquid state to form a hermetic bond, it is necessary to heat the structure at a extremely high rate during the alloying process.

The second barrier layer 18 functions to limit the amount of gold available for diffusion with the bronzing agent 14 to the gold layer 20 disposed on top of the second barrier layer 18. As a result, the melting point of the lead-gold intermetallic compound formed during the alloying process is limited to a predefined temperature. This temperature is exceeded during the alloying process to ensure that the bond formed between the die 2 and the substrate 4 is a hermetic seal.

Figure 6:
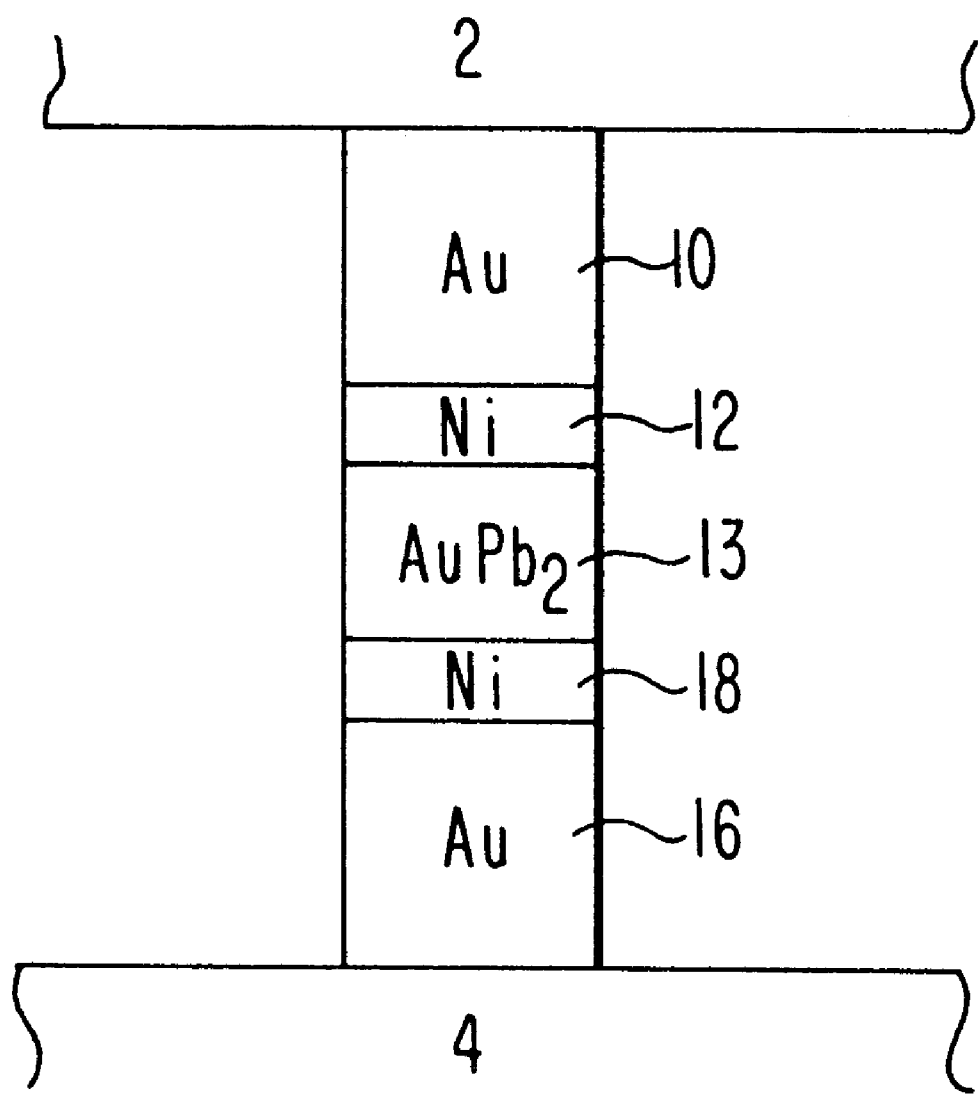
FIG. 6 illustrates a substantially enlarged side view of a flip-chip bond in accordance with the second embodiment of the present invention.

FIG. 6 illustrates a substantially enlarged view of a flip-chip bond in accordance with the second embodiment of the present invention. As shown in FIG. 6, after the alloying process the bronzing agent 14 is diffused with the gold layer 20 disposed on the second barrier layer 18 to form an intermetallic compound 13. As in the first embodiment, this is a gold-lead intermetallic compound.

The method and structure of the present invention can also be utilized to form a hermetic seal between the integrated circuit die 2 and the substrate 4 during the flip-chip bonding process. Referring to FIG. 1, this is accomplished by forming a first continuous gold band 7 on the die 2 such that the first gold band 7 surrounds the active circuitry. The first gold band 7 is formed having the same construction as bump 6 described above, except that it is continuous in the form of a ring, or any other desired shape. Next, a second continuous gold band 9 is formed on the substrate 4. The second gold band 9 is formed having the same construction as the gold bump 16 disposed on the bonding pad 8, and it exhibits a shape which is substantially the mirror image of the first gold band 7. In other words, a cross section of the first gold band 7 taken along line A–A' in FIG. 1 would be equivalent to the upper portion of FIG. 2 illustrating bump 6. Similarly, a cross section of the second gold band 9 taken along line B–B' in FIG. 1 would be equivalent to the lower portion of FIG. 2 illustrating bump 16.

The first and second gold bands are then brought into contact and bonded together in accordance with the present invention (i.e., in the identical manner as described above with regard to the bonding of bump 6 to bonding pad 8). The result is the formation of a hermetic seal encapsulating the integrated circuit components. Of course, the flip-chip bonding of the bumps and the formation of the hermetic seal would be accomplished simultaneously during the same bonding process.

Furthermore, the second continuous gold band 9 can also be modified to include the second barrier layer and the third gold layer (which would be in the form of a third continuous ring) as taught in the second embodiment of the present invention.

Importantly, the foregoing process allows for the height of the bond formed between the bumps 6 and associated bonding pad 8 to be the same as the height of the hermetic seal formed by the first and second gold ring 7,9. The width of the hermetic seal formed in accordance with the present invention can be as minimal as approximately 30 microns.

The flip-chip bonding method of the present invention provides numerous advantages. Specifically, the novel flip-chip bonding method provides a bonding process that does not require the use of flux or excessive compression forces and which exhibits improved reliability performance. In addition, the method and structure of the present invention provides for the hermetic sealing of the die simultaneously with the bonding of the die to the substrate.

Of course, it should be understood that a wide range of changes and modifications can be made to the preferred embodiment described above. It is therefore intended that the foregoing detailed description be regarded as illustrative rather than limiting and that it be understood that it is the following claims, including all equivalents, which are intended to define the scope of the invention.

What is claimed is:

1. A method for flip-chip bonding an integrated circuit die to a substrate, comprising the steps of:

providing said integrated circuit die with at least one gold bump, forming a barrier layer on said gold bump, forming a bronzing agent on said barrier layer, and providing said substrate with at least one conductive bonding area, said bonding area covered with gold.

2. The method of claim 1 further comprising exposing said bronzing agent to a plasma comprising fluorine such that fluorine-containing compounds form on said bronzing agent so as to allow wetting to occur.

3. The method of claim 1, wherein said gold bump comprises at least about 90 weight % Au, said barrier layer comprises at least about 90 weight % Ni, and said bronzing agent is about 100 weight % Pb.

4. The method of claim 1, wherein said bronzing agent comprises a lead-indium alloy.

5. The method of claim 1, wherein said bronzing agent is pure indium.

6. The method of claim 1 further comprising depositing a film of gold on said bronzing agent so as to prevent oxidation of said bronzing agent.

7. The method of claim 1 further comprising depositing a film of platinum on said bronzing agent so as to prevent oxidation of said bronzing agent.

8. The method of claim 1 further comprising:

aligning said bronzing agent of said integrated circuit die on said conductive bonding area of said substrate;

providing a compression force so as to establish contact between said bronzing agent of said integrated circuit die and said conductive bonding area of said substrate; and alloying said bronzing agent on said integrated circuit die such that said bronzing agent and said gold on said conductive bonding area of said substrate form an intermetallic compound.

9. The method of claim 8, wherein said alloying comprises:

subjecting said integrated circuit die and said substrate to a background temperature while maintaining said compression force, said background temperature sufficient to allow said bronzing agent to yield, said compression force sufficient to deform said bronzing agent at said background temperature;

allowing said bronzing agent to yield;

maintaining a distance between said gold bump and said conductive bonding pad; and subjecting said integrated circuit die and said substrate to a bonding temperature.

10. The method of claim 9, wherein said barrier layer prevents said gold bump from diffusing into said bronzing agent during said alloying process.

11. The method of claim 8, wherein said intermetallic compound is a AuPb2.

12. The method of claim 9, wherein when subject to said bonding temperature during said alloying process, said intermetallic compound enters a liquid state such that upon cooling a hermetic bond is formed.

13. The method of claim 9, wherein said compression force is greater than the yield limit of said bronzing agent and less than the yield limit of said gold bump.

14. The method of claim 13 wherein allowing said bronzing agent to yield adjusts the height of the combination of said gold bump and said barrier layer by deforming said bronzing agent.

15. The method of claim 8, wherein the compression force ranges from about 0.03 to about 0.2 N per gold bump.

16. A method for flip-chip bonding an integrated circuit die to a substrate, comprising the steps of:
  providing said integrated circuit die with a first gold bump;
  forming a first barrier layer on said first gold bump;
  forming a bronzing agent on said barrier layer;
  providing said substrate with a conductive bonding area comprising a second gold bump;
  forming a second barrier layer on said conductive bonding area; and
  forming a gold layer on said second barrier layer.

17. The method of claim 16 further comprising exposing said bronzing agent to a plasma comprising fluorine containing species such that fluorine-containing compounds form on said bronzing agent so as to allow wetting to occur.

18. The method of claim 16, wherein said first and second gold bumps comprise at least about 90 weight % Au, said first and second barrier layers comprise at least about 90 weight % Ni, and said bronzing agent is about 100 weight % Pb.

19. The method of claim 16, wherein said bronzing agent comprises a lead-indium alloy.

20. The method of claim 16, wherein said bronzing agent is pure indium.

21. The method of claim 16 further comprising depositing a film of gold on said bronzing agent so as to prevent oxidation of said bronzing agent.

22. The method of claim 16 further comprising depositing a film of platinum on said bronzing agent so as to prevent oxidation of said bronzing agent.

23. The method of claim 16 further comprising:
  aligning said bronzing agent of said integrated circuit die on said gold layer disposed on said second barrier layer;
  providing a compression force so as to establish contact between said bronzing agent of said integrated circuit die and said gold layer disposed on said second barrier layer; and
  alloying said bronzing agent of said integrated circuit die such that said bronzing agent and said gold layer disposed on said second barrier layer form an intermetallic compound.

24. The method of claim 23, wherein said alloying comprises:
  subjecting said integrated circuit die and said substrate to a background temperature while maintaining said compression force, said background temperature sufficient to allow said bronzing agent to yield, said compression force sufficient to deform said bronzing agent at said background temperature;
  allowing said bronzing agent to yield;
  maintaining the distance between said first gold bump and said second gold bump; and
  subjecting said integrated circuit die and said substrate to a bonding temperature.

25. The method of claim 24, wherein said first barrier layer prevents said first gold bump from diffusing into said bronzing agent during said alloying process.

26. The method of claim 24, wherein said second barrier layer prevents the second gold bump from diffusing into the bronzing agent during said alloying process.

27. The method of claim 23, wherein said intermetallic compound is a AuPb2.

28. The method of claim 24, wherein when subject to said background temperature during said alloying process, said intermetallic compound enters a liquid state such that upon cooling a hermetic bond is formed.

29. The method of claim 24, wherein said compression force is greater than the yield limit of said bronzing agent and less than the yield limit of said first and second gold bumps.

30. The method of claim 29, wherein allowing said bronzing agent to yield adjusts the distance separating the integrated circuit die and the substrate by deforming said bronzing agent.

31. The method of claim 23, wherein the compression force ranges from about 0.03 to about 0.20 N grams per bond being formed.

* * * * *

(12) EX PARTE REEXAMINATION CERTIFICATE (6286th)
United States Patent
Poenisch et al.

(10) Number: US 5,985,692 C1
(45) Certificate Issued: Jul. 8, 2008

(54) PROCESS FOR FLIP-CHIP BONDING A SEMICONDUCTOR DIE HAVING GOLD BUMP ELECTRODES

(75) Inventors: Paul Poenisch, Santa Clara, CA (US); James A. Matthews, Milpitas, CA (US); Trancy Tsao, Saratoga, CA (US)

(73) Assignee: MicroUnity Systems Engineering, Inc., Sunnyvale, CA (US)

Reexamination Request:
No. 90/007,758, Oct. 7, 2005

Reexamination Certificate for:
Patent No.: 5,985,692
Issued: Nov. 16, 1999
Appl. No.: 08/478,114
Filed: Jun. 7, 1995

(51) Int. Cl.
*H01L 21/02* (2006.01)
*H01L 21/60* (2006.01)
*H01L 23/48* (2006.01)
*H01L 23/485* (2006.01)

(52) U.S. Cl. ............... 438/106; 438/115; 438/614; 438/615; 438/653; 438/654; 438/661; 438/677; 438/686; 438/760; 438/763; 228/180.22; 257/E21.511; 257/E23.021

(58) Field of Classification Search ............... None
See application file for complete search history.

(56) References Cited

U.S. PATENT DOCUMENTS

| | | | | |
|---|---|---|---|---|
| 3,362,851 A | * | 1/1968 | Dunster | 428/601 |
| 3,505,041 A | * | 4/1970 | Bronnes et al. | 428/621 |
| 3,761,309 A | * | 9/1973 | Schmitter et al. | 428/600 |
| 4,764,846 A | * | 8/1988 | Go | 361/708 |
| 4,875,617 A | * | 10/1989 | Citowsky | 228/123.1 |
| 4,921,157 A | * | 5/1990 | Dishon et al. | 228/124.1 |
| 5,028,454 A | * | 7/1991 | Lytle et al. | 427/123 |
| 5,149,671 A | * | 9/1992 | Koh et al. | 438/59 |
| 5,341,980 A | * | 8/1994 | Nishikawa et al. | 228/205 |
| 5,391,514 A | * | 2/1995 | Gall et al. | 228/123.1 |

FOREIGN PATENT DOCUMENTS

JP 55-15235 * 2/1980

OTHER PUBLICATIONS

Merle C. Nutt, Metallurgy & Plastics for Engineers, 1976, pp. 444–445.
Howard H. Manko, Solders and Soldering, 1979, p. 2, sections 1–2.

* cited by examiner

*Primary Examiner*—Dwayne Jones

(57) ABSTRACT

A method for flip-chip bonding an integrated circuit die to a substrate. The method includes the steps of providing the integrated circuit die with at least one gold bump, forming a barrier layer on the gold bump, forming a bronzing agent on the barrier layer, and providing the substrate with at least one conductive bonding area, which is also covered with gold. The bronzing agent on the integrated circuit die is then aligned on the conductive bonding area, and a compression force is applied to the die and substrate so as to establish contact between the bronzing agent and the conductive bonding area. While maintaining position between the gold bump and conductive bonding area, the structure is alloyed such that the bronzing agent and the gold on the conductive bonding area form an intermetallic compound, thereby forming a bond between the die and the substrate. The barrier layer functions to prevent the bronzing agent from diffusing with the gold bump.

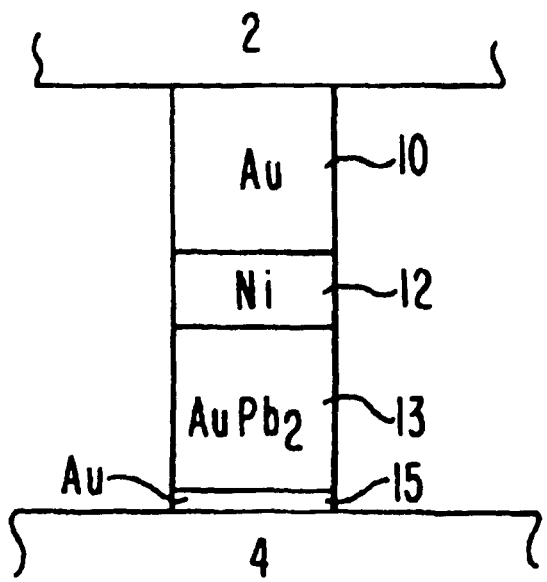

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 16–31 is confirmed.

Claim 8 is cancelled.

Claims 1, 9, 11 and 15 are determined to be patentable as amended.

Claims 2–7, 10, and 12–14, dependent on an amended claim, are determined to be patentable.

New claims 32–35 are added and determined to be patentable.

1. A method for flip-chip bonding an integrated circuit die to a substrate, comprising the steps of:
  providing said integrated circuit die with at least one gold bump,
  forming a barrier layer on said gold bump,
  forming a bronzing agent on said barrier layer, [and]
  providing said substrate with at least one conductive bonding area, said bonding area covered with gold;
  *aligning said bronzing agent of said integrated circuit die on said conductive bonding area of said substrate;*
  *providing a compression force so as to establish contact between said bronzing agent of said integrated circuit die and said conductive bonding area of said substrate; and*
  *alloying said bronzing agent on said integrated circuit die such that said bronzing agent and said gold on said conductive bonding area of said substrate equilibrate and form an intermetallic compound.*

9. The method of claim [8] *1* wherein said alloying comprises:
  subjecting said integrated circuit die and said substrate to a background temperature while maintaining said compression force, said background temperature sufficient to allow said bronzing agent to yield, said compression force sufficient to deform said bronzing agent at said background temperature;
  allowing said bronzing agent to yield;
  maintaining a distance between said gold bump and said conductive bonding pad; and
  subjecting said integrated circuit die and said substrate to a bonding temperature.

11. The method of claim [8] *1* wherein said intermetallic compound is a AuPb2.

15. The method of claim [8] *1* wherein the compression force ranges from about 0.03 to about 0.2 N per gold bump.

*32. The method of claim 1 wherein said barrier layer comprises nickel.*

*33. The method of claim 1 wherein said barrier layer comprises chromium.*

*34. The method of claim 1 wherein said barrier layer comprises tungsten.*

*35. A method for flip-chip bonding an integrated circuit die to a substrate, comprising the steps of:*
  *providing said integrated circuit die with a plurality of gold bumps;*
  *estimating a maximum expected height variation of said plurality of gold bumps;*
  *forming a barrier layer on said plurality of gold bumps;*
  *forming a bronzing agent on said barrier layer, wherein the minimum thickness of said bronzing agent is greater than said maximum expected height variation;*
  *providing said substrate with a plurality of conductive bonding areas, said plurality of bonding areas covered with gold;*
  *aligning said bronzing agent of said integrated circuit die on said plurality of conductive bonding areas of said substrate;*
  *providing a compression force so as to establish contact between said bronzing agent of said integrated circuit die and said plurality of conductive bonding areas of said substrate;*
  *alloying said bronzing agent on said integrated circuit die such that said bronzing agent and said gold on said plurality of conductive bonding areas of said substrate equilibrate and form an intermetallic compound; and*
  *wherein the maximum thickness of said bronzing agent is governed by the requirement that once deformed said bronzing agent does not contact any adjacent gold bumps or any deformed bronzing agent located on said adjacent gold bumps.*

\* \* \* \* \*